US012641887B2

(12) United States Patent
Wang et al.

(10) Patent No.: US 12,641,887 B2
(45) **Date of Patent: *May 26, 2026**

(54) DISPLAY PANELS INCLUDING METAL LAYER HAVING FAN-OUT SEGMENT AND DISPLAY TERMINALS INCLUDING THE SAME

(71) Applicant: Shenzhen China Star Optoelectronics Semiconductor Display Technology Co., Ltd., Shenzhen (CN)

(72) Inventors: Xin Wang, Shenzhen (CN); Xiaoxia Zhang, Shenzhen (CN); Huanxi Zhang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/931,006

(22) Filed: Oct. 29, 2024

(65) Prior Publication Data

US 2025/0056890 A1 Feb. 13, 2025

Related U.S. Application Data

(63) Continuation of application No. 18/360,821, filed on Jul. 28, 2023, now Pat. No. 12,154,910, which is a (Continued)

(30) Foreign Application Priority Data

May 8, 2023 (CN) .......................... 202310515219.4

(51) Int. Cl.
H10D 86/60 (2025.01)
G09G 3/32 (2016.01)
H10D 86/40 (2025.01)

(52) U.S. Cl.
CPC .............. *H10D 86/60* (2025.01); *G09G 3/32* (2013.01); *H10D 86/441* (2025.01); *G09G 2300/0426* (2013.01); *G09G 2320/0247* (2013.01)

(58) Field of Classification Search
CPC ..................................................... H10D 86/60
See application file for complete search history.

(56) References Cited

U.S. PATENT DOCUMENTS

2021/0035521 A1* 2/2021 Qiu ...................... G09G 3/3275
2021/0336107 A1* 10/2021 Jiang ...................... H10H 20/01
2022/0320221 A1 10/2022 Wang et al.

FOREIGN PATENT DOCUMENTS

CN 115472657 A 12/2022
CN 115768203 A 3/2023
(Continued)

OTHER PUBLICATIONS

International Search Report in International application No. PCT/CN2023/094457, mailed on Jan. 22, 2024.
(Continued)

*Primary Examiner* — Chun-Nan Lin
(74) *Attorney, Agent, or Firm* — PV IP PC; Peter Stecher; Wei Te Chung

(57) ABSTRACT

The present application provides a display panel and a display terminal. The display panel includes a first metal layer having a plurality of first fan-out segments, and a third metal layer having a plurality of second fan-out segments, where the second fan-out segments extend in the same direction, the first fan-out segments and the second fan-out (Continued)

segments are located in a display area, one end of the first fan-out segment is electrically connected to one of the second fan-out segments.

20 Claims, 9 Drawing Sheets

Related U.S. Application Data continuation of application No. PCT/CN2023/094457, filed on May 16, 2023.

(56)                References Cited

FOREIGN PATENT DOCUMENTS

| | | | |
|---|---|---|---|
| CN | 116075182 A | 5/2023 | |
| CN | 116075182 * | 6/2023 | ............. H10K 59/12 |
| KR | 20230053754 A | 4/2023 | |

OTHER PUBLICATIONS

Written Opinion of the International Search Authority in International application No. PCT/CN2023/094457, mailed on Jan. 22, 2024.
Korean Office Action issued in corresponding Korean Patent Application No.10-2023-7025747 dated Jul. 8,2025, pp. 1-13.

\* cited by examiner

DISPLAY PANELS INCLUDING METAL LAYER HAVING FAN-OUT SEGMENT AND DISPLAY TERMINALS INCLUDING THE SAME

CROSS-REFERENCE TO RELATED APPLICATION(S)

This application is a continuation application of U.S. application Ser. No. 18/360,821, filed on Jul. 28, 2023, which is a continuation of International Application No. PCT/CN2023/094457, filed on May 16, 2023, which claims priority to and the benefit of Chinese Patent Application No. 202310515219.4, filed on May 8, 2023. The entire disclosures of the aforementioned applications are incorporated herein by reference in their entireties.

TECHNICAL FIELD

The present application relates to the field of display technologies, and in particular to a display panel and a display terminal.

BACKGROUND

An Organic Light-Emitting Diode (OLED) display technology is a new type of display technology that is gradually gaining attention and occupies a certain position in the field of panel display technologies due to its unique advantages such as low power consumption, high saturation, fast response time, and wide viewing angle.

Fan-out in Active Area (FIAA) is a design scheme in which a fan-out wiring is provided in a display area to solve difficulty of the fan-out wiring in a narrow frame, an ultra-narrow frame, or a bottom frame. In the related art, the FIAA may perform arrangement of fan-out wirings with three metal layers of wirings, where a horizontally disposed fan-out wiring and a longitudinally disposed fan-out wiring of the fan-out wirings are both disposed in the top metal layer of the three metal layers. Since the horizontally disposed fan-out wiring needs to transmit a data signal to a corresponding data line, the horizontally disposed fan-out wiring has a fracture, resulting in a difference in metal patterns in the top metal layer. The difference may be visually visible to a user in a screen-off state, thereby causing mura of the screen.

Therefore, there is an urgent need to provide a display panel to improve the mura of the screen due to the use of two metal layers of wirings of the FIAA.

SUMMARY

An embodiment of the present application provides a display panel including: a base substrate; a first metal layer disposed on the base substrate and including a plurality of first fan-out segments extending in a first direction, where the first fan-out segments are located in a display area of the display panel; a second metal layer disposed on one side of the first metal layer away from the base substrate and including a plurality of data wirings extending in a second direction, where the plurality of data wirings are located in the display area, and a first end of each of the first fan-out segments is electrically connected to one of the data wirings; and a third metal layer disposed on one side of the second metal layer away from the base substrate and including a plurality of second fan-out segments extending in the second direction, where the plurality of second fan-out segments are located in the display area, and a second end of the first fan-out segment is electrically connected to one of the second fan-out segments; where an included angle between the first direction and the second direction is greater than 0° and less than or equal to 90°.

Another embodiment of the present application further provides a display terminal, including a display panel, where the display panel includes: a base substrate; a first metal layer disposed on the base substrate and including a plurality of first fan-out segments extending in a first direction, where the first fan-out segments are located in a display area of the display panel; a second metal layer disposed on one side of the first metal layer away from the base substrate and including a plurality of data wirings extending in a second direction, where the plurality of data wirings are located in the display area, and a first end of each of the first fan-out segments is electrically connected to one of the data wirings; and a third metal layer disposed on one side of the second metal layer away from the base substrate and including a plurality of second fan-out segments extending in the second direction, where the plurality of second fan-out segments are located in the display area, and a second end of the first fan-out segment is electrically connected to one of the second fan-out segments; where an included angle between the first direction and the second direction is greater than 0° and less than or equal to 90°.

DETAILED DESCRIPTION

Figure 1:
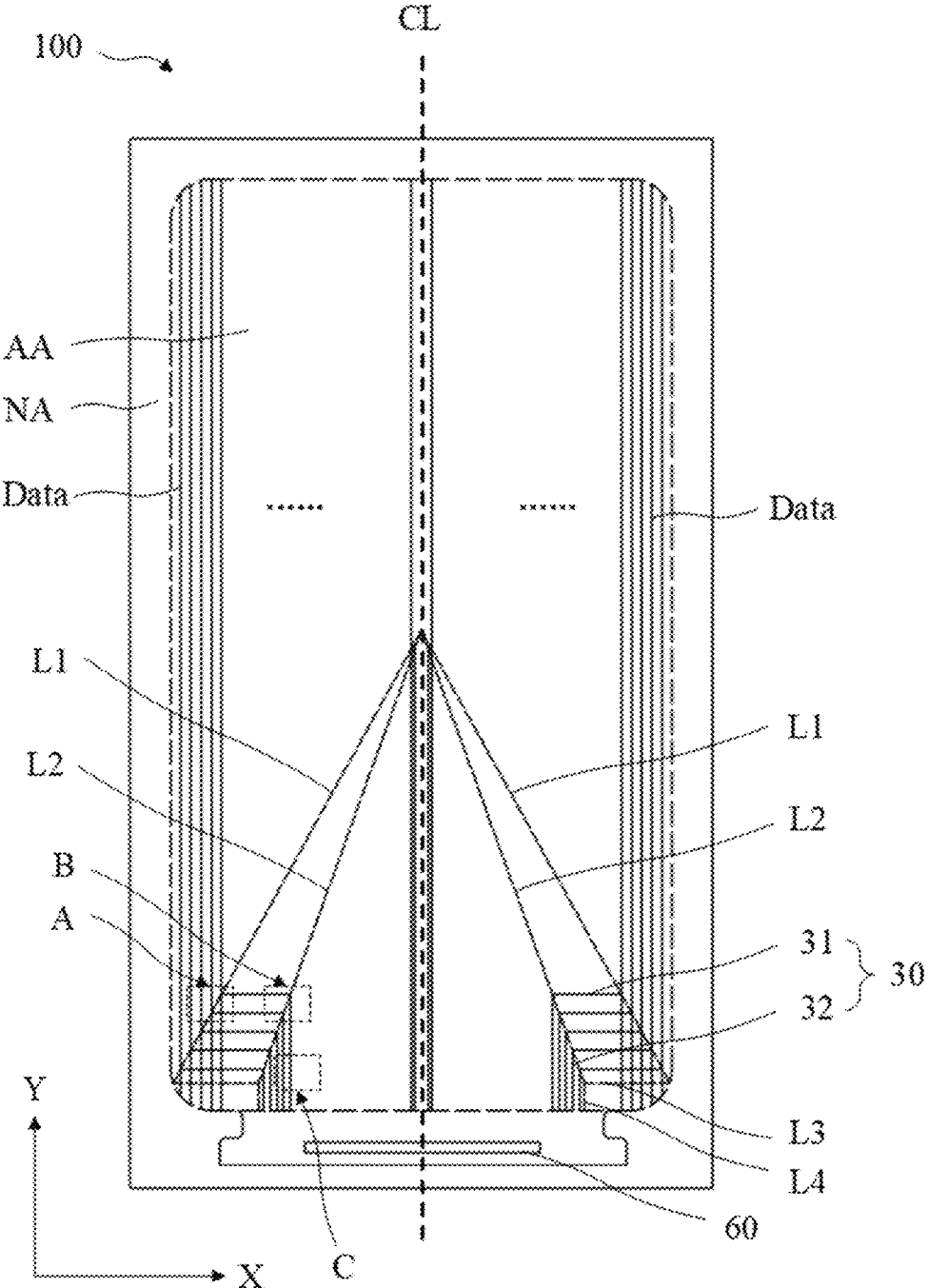
FIG. 1 is a diagram of a display panel according to an embodiment of the present application.

To make the objectives, technical solutions, and effects of the present application more clear and definite, the present application is illustrated in detail below by referring to the accompanying drawings and illustrating the embodiments. It should be understood that the specific implementations described here are only used to explain the present application, and are not used to limit the present application.

In the related art, the FIAA may perform arrangement of fan-out wirings with three metal layers of wirings, where a horizontally disposed fan-out wiring and a longitudinally disposed fan-out wiring of the fan-out wirings are both disposed in the top metal layer of the three metal layers. Since the horizontally disposed fan-out wiring needs to transmit a data signal to a corresponding data wiring Data, the horizontally disposed fan-out wiring has a fracture, resulting in a difference in metal patterns in the top metal layer. The difference may be visually visible to a user in a screen-off state, thereby causing mura of the screen. The present application proposes following solutions based on the above-mentioned technical problem.

As shown in FIGS. 1 to 10, an embodiment of the present application may provide a display panel 100, where the display panel 100 may include a base substrate 10, and a first metal layer M1, a second metal layer M2, and a third metal layer M3 all disposed on the base substrate 10.

In the present embodiment, the first metal layer M1 may be disposed on the base substrate 10 and include a plurality of first fan-out segments 31 extending in a first direction X, where the plurality of first fan-out segments 31 may be located in a display area AA of the display panel 100. The second metal layer M2 may be disposed on a side of the first metal layer M1 away from the base substrate 10 and include a plurality of data wirings Data extending in the second direction Y, where the plurality of data wirings Data may be located in the display area AA, and a first end of each of the first fan-out segments 31 may be electrically connected to one of the data wirings Data. The third metal layer M3 may be provided on a side of the second metal layer M2 away from the base substrate 10 and include a plurality of second fan-out segments 32 extending in a second direction Y, where the plurality of second fan-out segments 32 may be located in the display area AA, and a second end of the first fan-out segment 31 may be electrically connected to one of the second fan-out segments 32.

In the present embodiment, an included angle between the first direction X and the second direction Y may be greater than 0° and less than or equal to 90°. Referring to FIG. 1, the first direction X may be parallel to an extension direction of a scanning line in the display panel 100, and the second direction Y may be perpendicular to the first direction X.

In the present embodiment, a fan-out wiring 30 of the display panel 100 may be formed by one of the first fan-out segments 31 and one of the second fan-out segments 32.

In the present application, the plurality of first fan-out segments 31 extending in the first direction X are transferred from the third metal layer M3 to the first metal layer M1, and fractures of the first fan-out segments 31 are located in the first metal layer M1, so that a difference in metal patterns of the first fan-out segments 31 are located in the lower metal layer, a spacing between the first fan-out segments 31 and a light-emitting surface is increased, and shielding of the upper metal layer is further combined. As such, a mapping of the difference on the display screen is weakened, thereby improving the mura of the screen.

Technical solutions of the present application will be described now in conjunction with specific embodiments of the present application.

Referring to FIG. 1, the display panel may include a display area AA and a non-display area NA disposed adjacent to the display area AA. Alternatively, the non-display area NA surrounds the display area AA so that the display area AA is surrounded by the non-display area NA. The display area AA may be an area in the display panel 100 for performing a display function, and can be internally provided with a plurality of display units for implementing the display function. The non-display area NA may be a frame area of the display panel 100, and can be internally provided with a functional component for assisting in display of the display units within the display area AA.

Referring to FIG. 1, the lower side of the display area AA may be provided with a binding terminal 60, which may be connected to an external circuit and transmit a signal input from the external circuit to the data wiring Data, thereby driving the display panel 100 to display a picture. For example, the binding terminal 60 may be bound to a chip, a thin film (such as a flip-chip thin film), or the like for supplying a power source, a driving signal, or the like to the display panel 100. In the present application, the plurality of fan-out wires 30 are provided in the display area AA, so that a horizontal distance between the binding terminal 60 and a side frame of the display panel 100 can be increased, that is, larger Lithographic cutting (i.e., L-cut) can be implemented, thereby facilitating a production process of the display panel.

Figure 2:
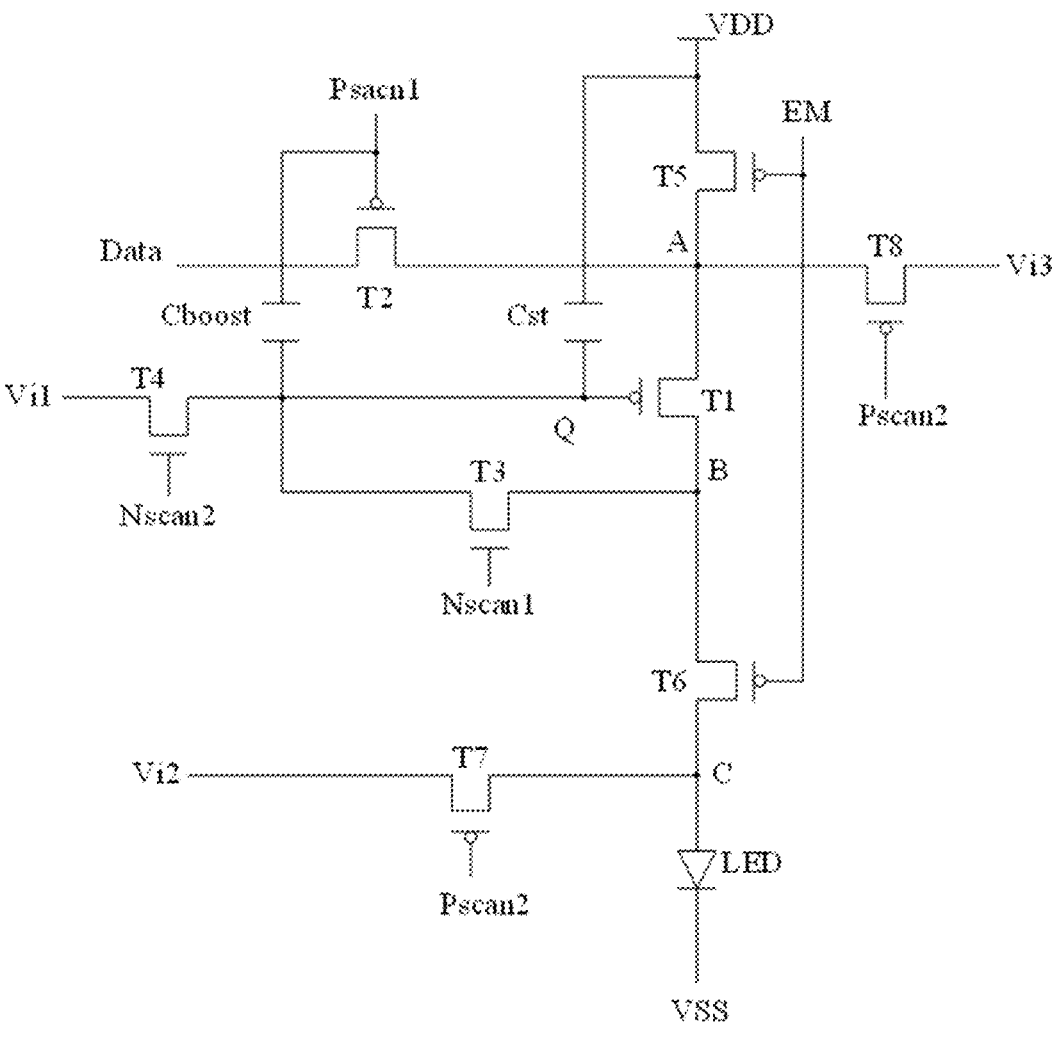
FIG. 2 is an equivalent circuit diagram of a sub-pixel circuit in a display panel according to an embodiment of the present application.
Figure 3:
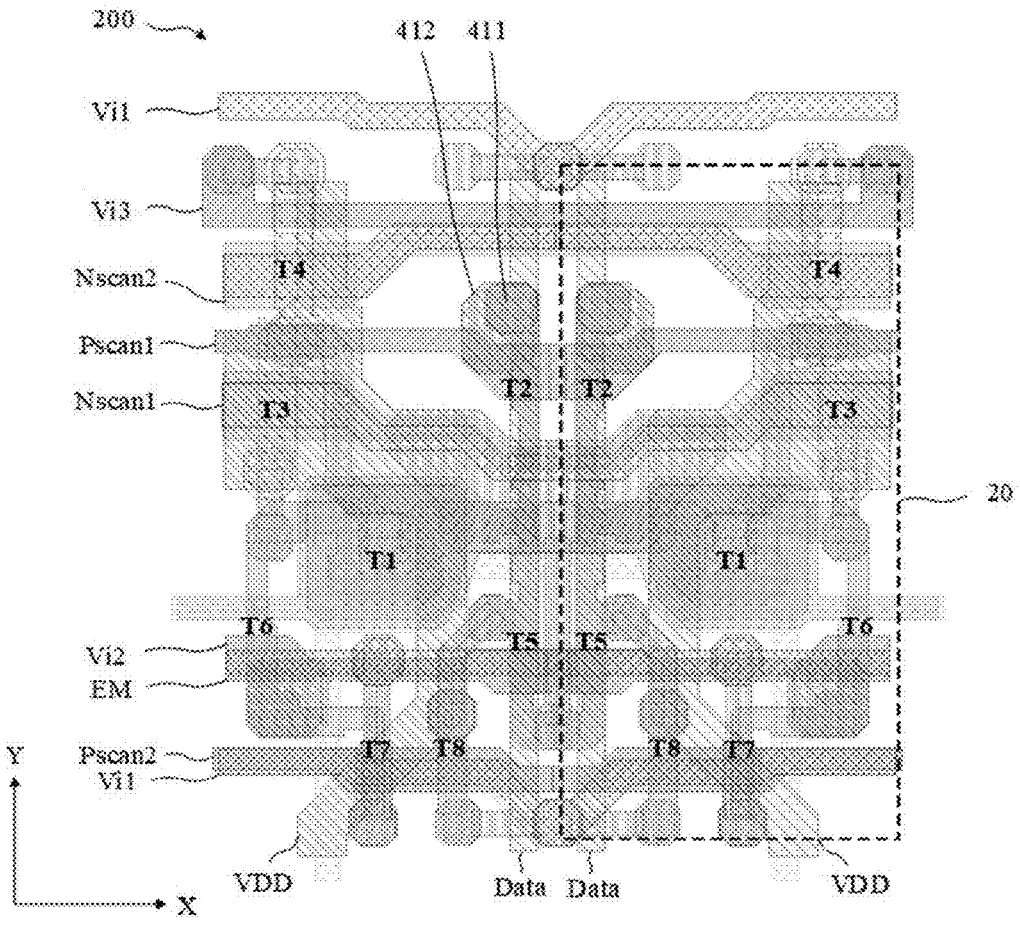
FIG. 3 is a diagram of a stack of film layers of a sub-pixel circuit group in a display panel according to an embodiment of the present application.

Referring to FIGS. 2 and 3, a plurality of light emitting device LEDs and a plurality of sub-pixel circuits 20 for driving the light emitting devices LEDs may be arranged in an array in the display area AA. FIG. 2 shows an equivalent circuit diagram of one of the sub-pixel circuits 20. FIG. 3 shows a diagram of a stack of film layers of two of the sub-pixel circuits 20.

In the present embodiment, the one of the sub-pixel circuits 20 may include a driving transistor T1, a switching transistor T2, a compensation transistor T3, a first initialization transistor T4, a first light-emitting control transistor T5, a second light-emitting control transistor T6, a second initialization transistor T7, and a third initialization transistor T8.

Referring to FIGS. 2 and 3, the switching transistor T2 and the driving transistor T1 may be connected to a first node A, the compensation transistor T3 may be connected to a first scanning signal line Nscan1, all of the compensation transistor T3, the driving transistor T1, and each of the light emitting devices LEDs may be connected to a second node B, the first initialization transistor T4 may be connected to a second scanning signal line Nscan2, all of the first initialization transistor T4, the driving transistor T1, and the compensation transistor T3 may be connected to a third node Q, and the first initialization transistor T4 may be connected to a first initialization signal line Vi1.

Referring to FIGS. 2 and 3, a gate of the switching transistor T2 may be connected to a third scanning signal line Pscan1, and a first electrode of the switching transistor T2 may be connected to the data signal line Data; a first electrode of the second initialization transistor T7 may be connected to a second initialization signal line Vi2, a second electrode of the second initialization transistor T7 and the light emitting device LED may be connected to a fourth node C, and a gate of the second initialization transistor T7 may be connected to a fourth scanning signal line Pscan2; the first light-emitting control transistor T5 may be connected to the driving transistor T1 through the first node A and connected to a light emission control signal line EM; the second light-emitting control transistor T6 may be connected to the driving transistor T1 through the second node B; and the third initialization transistor T8 may be connected to an anode reset line Vi3; the light-emitting device LED may be connected to a constant-voltage low-level line VSS.

Referring to FIGS. 2 and 3, the sub-pixel circuit 20 further includes: a storage capacitor Cst, where one terminal of the storage capacitor Cst may be connected to a constant-voltage high-level line VDD, and another terminal of the storage capacitor Cst may be connected to the third node Q; and a boost capacitor Cboost, where one terminal of the boost capacitor Cboost may be connected to the gate of the switching transistor T2, and another terminal of the boost capacitor Cboost may be connected to the third node Q.

In the present embodiment, the present application controls the first light-emitting control transistor T5 and the second light-emitting control transistor T6 using the light emission control signal line EM, controls the compensation transistor T3 using the first scanning signal line Nscan1, controls the first initialization transistor T4 using the second scanning signal line Nscan2, controls the switching transistor T2 using the third scanning signal line Pscan1, and controls the second initialization transistor T7 and the third initialization transistor T8 using the fourth scanning signal line Pscan2, thereby achieving normal operation of the display panel 100.

Film layers of the display panel 100 of the present application will be described below with reference to the configurations of FIGS. 2 and 3.

Figure 4:
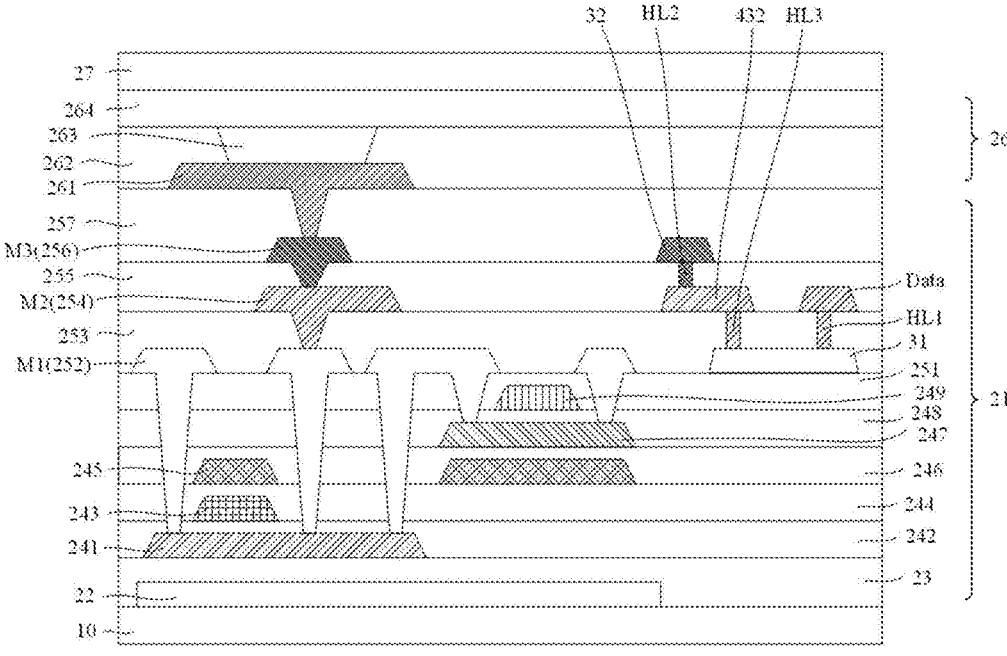
FIG. 4 is a diagram of film layers in a display panel according to an embodiment of the present application.

Referring to FIG. 4, the display panel 100 may include a base substrate 10, a driving circuit layer 21 disposed on the base substrate 10, a pixel definition layer 262 disposed on the driving circuit layer 21, a light emitting device layer 26 disposed on the same layer as the pixel definition layer 262, and an encapsulation layer 27 disposed on the pixel definition layer 262.

In the present embodiment, the base substrate 10 supports the layers provided on the base substrate 10. When the display panel 100 is a bottom emission light-emitting display device or a double-side emission light-emitting display device, a transparent base substrate may be used. When the display panel 100 is a top emission light-emitting display device, any of a translucent base substrate, an opaque base substrate, or a transparent base substrate may be used.

In the present embodiment, the base substrate 10 is a single-layer or multi-layer composite film layer made of an insulating material such as glass, quartz or a polymer resin. The base substrate 10 may be a rigid substrate or a flexible substrate that may be bent, folded, crimped, or the like. An example of a flexible material for the flexible substrate includes, but is not limited to, polyimide (PI).

Referring to FIG. 4, the driving circuit layer 21 may include a plurality of thin film transistors. At least one of the thin film transistors may be an Etch Stop Type of thin film transistor or a Back Channel Etch Type of thin film transistor. At least one of the thin film transistors may be a bottom-gate thin film transistor or a top-gate thin film transistor according to the position of a gate of the thin film transistor relative to an active layer. At least one of the thin film transistors may be an N-type thin film transistor or a P-type thin film transistor according to the performance of the thin film transistor. The thin film transistor in FIG. 4 does not represent a structural diagram of any one of the transistors in FIG. 2, but is only a schematic diagram of one of the layers of the display panel 100 according to an embodiment of the present application.

Referring to FIG. 4, the driving circuit layer 21 may include a light shielding layer 22, a buffer layer 23, a first active layer 241, a first gate insulating layer 242, a first gate layer 243, a second gate insulating layer 244, a second gate layer 245, a third gate insulating layer 246, a second active layer, a fourth gate insulating layer 248, a third gate layer 249, a first interlayer insulating layer 251, a first metal layer M1, a second interlayer insulating layer 253, a second metal layer M2, a third interlayer insulating layer 255, a third metal layer M3, and a planarization layer 257 stacked in sequence, where the first metal layer M1, the second metal layer M2, and the third metal layer M3 may be a first source drain metal layer 252, a second source drain metal layer 254, and a third source drain metal layer 256, respectively.

In the present embodiment, the second metal layer M2 may include a plurality of data wirings Data, a plurality of constant-voltage high-level lines VDD, and a plurality of constant-voltage low-level lines VSS, which are all extended in the second direction Y. The constant-voltage low-level lines VSS are located in the non-display area NA, the constant-voltage high-level lines VDD and the data wirings Data are located in the display area AA and disposed at intervals. The data wirings Data are configured to provide data signals for sub-pixels of the display panel 100, and the constant-voltage high-level lines VDD are configured to provide constant-voltage high-level signals.

In the present embodiment, the first metal layer M1 may include a plurality of first fan-out segments 31 extending in the first direction X, and the third metal layer M3 may include a plurality of second fan-out segments extending in the first direction X. One end of each of the first fan-out segments 31 is electrically connected to one of the data wirings Data, and another end of the first fan-out segment 31 is electrically connected to one of the second fan-out segments 32. The second fan-out segment can be wired to the first fan-out segment 31 through a corresponding through-hole, and a data signal transmitted from the binding terminal 60 can be transmitted to the corresponding data wiring Data through the first fan-out segment 31.

Referring to FIG. 4, the light-emitting device layer 26 may include an anode layer 261 disposed on the planarization layer, a light-emitting layer 263 disposed on the anode layer 261, and a cathode layer 264 disposed on the light-emitting layer 263. The anode layer 261 includes a plurality of anodes, the pixel definition layer 262 includes a plurality of pixel openings corresponding one-by-one to the plurality of anodes, and each of the pixel openings can correspondingly expose an upper surface of one of the anodes, and the light-emitting layer 263 may include a plurality of light-emitting pixels corresponding one-by-one to the plurality of anodes.

Referring to FIG. 4, an encapsulation layer 27 may cover the pixel definition layer 262 and successively cover a plurality of pixel openings and a plurality of light emitting pixels. The encapsulation layer 27 may include at least a first inorganic encapsulation layer, a first organic encapsulation layer, and a second inorganic encapsulation layer stacked on the pixel definition layer 262.

In the present embodiment, the display panel 100 may further include a touch control layer, a polarizing plate, and a cover plate layer provided on the encapsulation layer 27. Specific positions of the touch control layer, the polarizing plate, and the cover plate layer are not limited in the present application.

Referring to the configuration of FIGS. 2 to 4, a plurality of metal wirings extending in the second direction Y, such as the plurality of data wirings Data and the plurality of constant-voltage high-level lines VDD, can be arranged in the first direction X in one sub-pixel circuit 20. A plurality of metal wirings extending in the first direction X can be arranged in the second direction Y in one sub-pixel circuit 20. For example, the anode reset line Vi3, the fourth scanning signal line Pscan2, the light emission control signal line EM, the second initialization signal line Vi2, the first scanning signal line Nscan1, the third scanning signal line Pscan1, the second scanning signal line Nscan2, and the first initialization signal line Vi1 are all arranged in sequence in the second direction Y.

In the present embodiment, a plurality of light emission control signal lines EM and a plurality of anode reset lines Vi3 may be provided in an insulated manner between the base substrate 10 and the first metal layer M1, and may be partially overlapped in a top view direction of the display panel 100.

For example, referring to FIG. 3, the third scanning signal line Pscan1, the fourth scanning signal line Pscan2, the light emission control signal line EM, and the first initialization signal line Vi1 are all located at the first gate layer 243, the first scanning signal line Nscan1 and the second scanning signal line Nscan2 are both located at the second gate layer 245, the second initialization signal line Vi2 and the anode reset line Vi3 are both located at the third gate layer 249, and the data wirings Data and the constant-voltage high-level lines VDD are all located at the second metal layer M2, that is, on the second source drain metal layer 254.

In the present embodiment, since the wirings of the space are dense, the anode reset line Vi3 and the fourth scanning signal line Pscan2 at different layers are partially overlapped, and the light emission control signal line EM and the second initialization signal line Vi2 at different layers are partially overlapped, and the remaining of the wirings are disposed at intervals.

In the present embodiment, the first fan-out segments 31 and the second scanning signal line Nscan2 are partially overlapped.

In the present embodiment, the width of each of the first fan-out segments 31 in the second direction Y may be greater than the width of one of the second fan-out segments 32 in the first direction X.

In the present embodiment, the constant-voltage low-level lines VSS may be provided at the periphery of the display area AA and connected to the binding terminal 60, and constant-voltage high-level line VDD may be provided in the display area AA and extended to the binding terminal 60 in the second direction Y.

Figure 5:
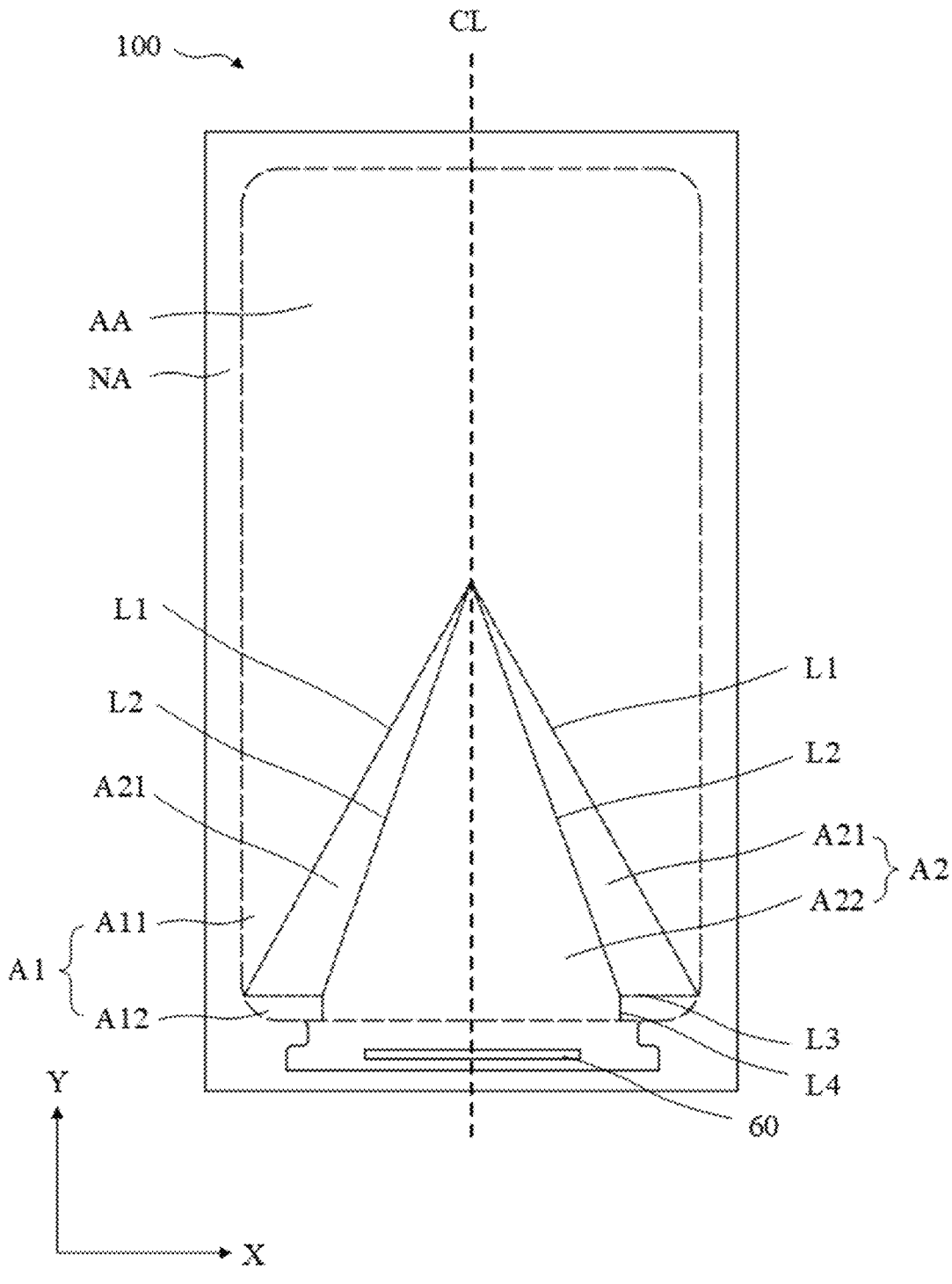
FIG. 5 is a diagram of a display panel according to another embodiment of the present application.

Referring to FIGS. 1 and 5, the display area AA may include a functional wiring area A1 and a fan-out wiring area A2, where the fan-out wiring area A2 may be located at one end of the display area AA close to the binding terminal 60, and the first fan-out segments 31 and the second fan-out segments 32 may be located in the fan-out wiring area A2.

Referring to FIG. 4, one end of the first fan-out segment 31 may be electrically connected to the data wiring Data through one of a plurality of first through-holes HL1, and the plurality of first through-holes HL1 may located at a first intersection line L1 between the fan-out wiring area A2 and the functional wiring area A1. Another end of the first fan-out segment 31 may be electrically connected to a corresponding one of the second fan-out segments 32 through a second through-hole HL2 and a third through-hole HL3, and a transition segment 432 located on the second metal layer M2 may be further provided between the second through-hole HL2 and the third through-hole HL3, the first fan-out segment 31 may be electrically connected to the second fan-out segment 32 through the transition segment 432, the first through-hole HL1 and the second through-hole HL2 can penetrate the third interlayer insulating layer 255, and the third through-hole HL3 may penetrate the planarization layer 257.

It should be noted that the first intersection line L1 between the fan-out wiring area A2 and the functional wiring area A1 may be an approximately straight line, and the plurality of through-holes HL1 are located at the first intersection line L1, or some of the first through-holes HL1 are located on a side of the first intersection line L1 close to the fan-out wiring area A2. That is, the first fan-out segments 31 and the second fan-out segments 32 may be located in the fan-out wiring area A2.

Figure 6:
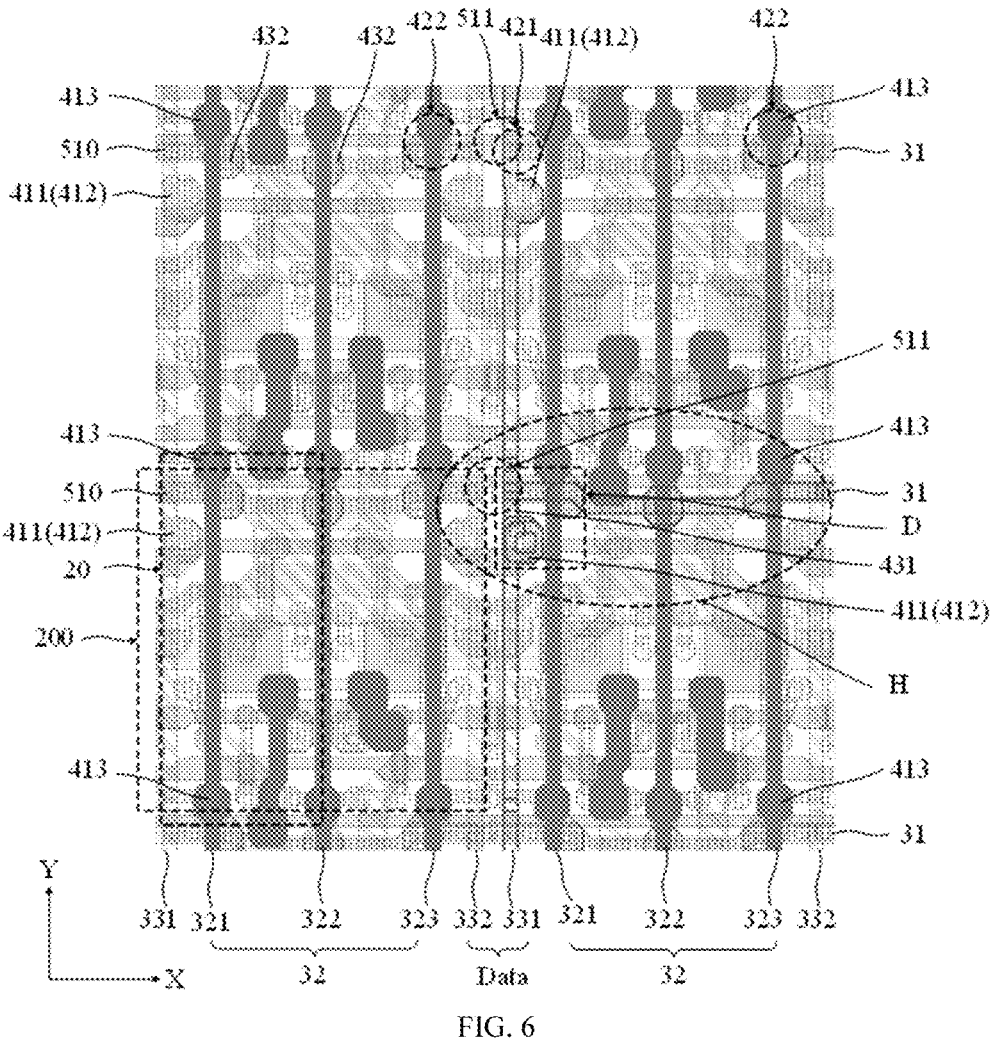
FIG. 6 is an enlarged view of a region A in FIG. 1.

As shown in FIG. 6, the second fan-out segments 32 may be extended in the second direction Y toward the binding terminal 60, and one end of each of the second fan-out segments 32 close to the binding terminal 60 may be electrically connected to the binding terminal 60 by the wirings. As shown in FIG. 1, one end of the second fan-out segment 32 away from the first fan-out segment 31 can coincide with the boundary of the display area AA.

Referring to FIGS. 1 and 5, the fan-out wiring area A2 may include a first wiring area A21 and a second wiring area A22, where the first fan-out segments 31 may be located in the first wiring area A21 and the second fan-out segments 32 may be located in the second wiring area A22. The first wiring region A21 may be adjacent to the second wiring region A22. The second wiring region A22 may be located at one side of the display region AA close to the binding terminal 60. The first wiring region A21 may be located on both sides of the second wiring region A22. As shown in FIG. 6, an inflection point between each of the first fan-out segment 31 and corresponding one of the second fan-out segments 32 may be located at the second intersection line L2L1 between the first wiring region A21 and the second wiring region A22. It should be noted that the second intersection line L2L1 between the first wiring region A21 and the second wiring region A22 may be an approximate straight line.

Referring to FIGS. 1 and 5, the first wiring area A21 may be two triangular areas that are symmetrical with respect to the center line CL of the display area AA. The second wiring region A22 may be a triangular region symmetrical with respect to the center line CL. The center line CL of the display area AA may refer to a straight line extending in the second direction Y and passing through the middle point of the display area AA, and be not actually present.

In the present embodiment, boundaries of the first wiring region A21 may be formed by the first intersection line L1 and the second boundary line L2L1, and boundaries of the second wiring region A22 may be formed by two second intersection lines L2L1 symmetrical with respect to the center line CL. The first intersection line L1 may refer to an approximate straight line near an end point of the first fan-out segment 31 away from the second fan-out segment 32. That is, the end point of the first fan-out segment 31 may be electrically connected to the data wiring Data through the first through-hole HL1, be located in the fan-out wiring area A2, and be distributed in the vicinity of the first intersection line L1. The first intersection line L1 is not actually present.

Similarly, the second intersection line L2L1 may refer to an approximate straight line near an inflection point (i.e., a connection point) between the first fan-out segment 31 and the second fan-out segment 32, and be not actually present. Since either the first wiring region A21 or the second wiring region A22 is both symmetrical with respect to the centerline CL, only the display panel 100 located at one side of the centerline CL will be described in detail in the present application, and the display panel located at another side of the centerline CL is disposed correspondingly.

As shown in FIG. 5, the functional wiring area A1 may include: a first functional area A11 located at one side of the first wiring area A21 away from the binding terminal 60; and a second functional area A12 located at one side of the first wiring area A21 close to the binding terminal 60, where a third intersection line L3 between the second functional area A12 and the first wiring area A21 may be parallel to the first direction X, and a fourth intersection line L4 between the second functional area A12 and the second wiring area A22 may be parallel to the second direction Y. That is, the functional wiring area A1 may be divided by the first wiring area A21 and the second wiring area A22 into two areas, i.e., the first functional area A11 and the second functional area A12.

Figure 7:
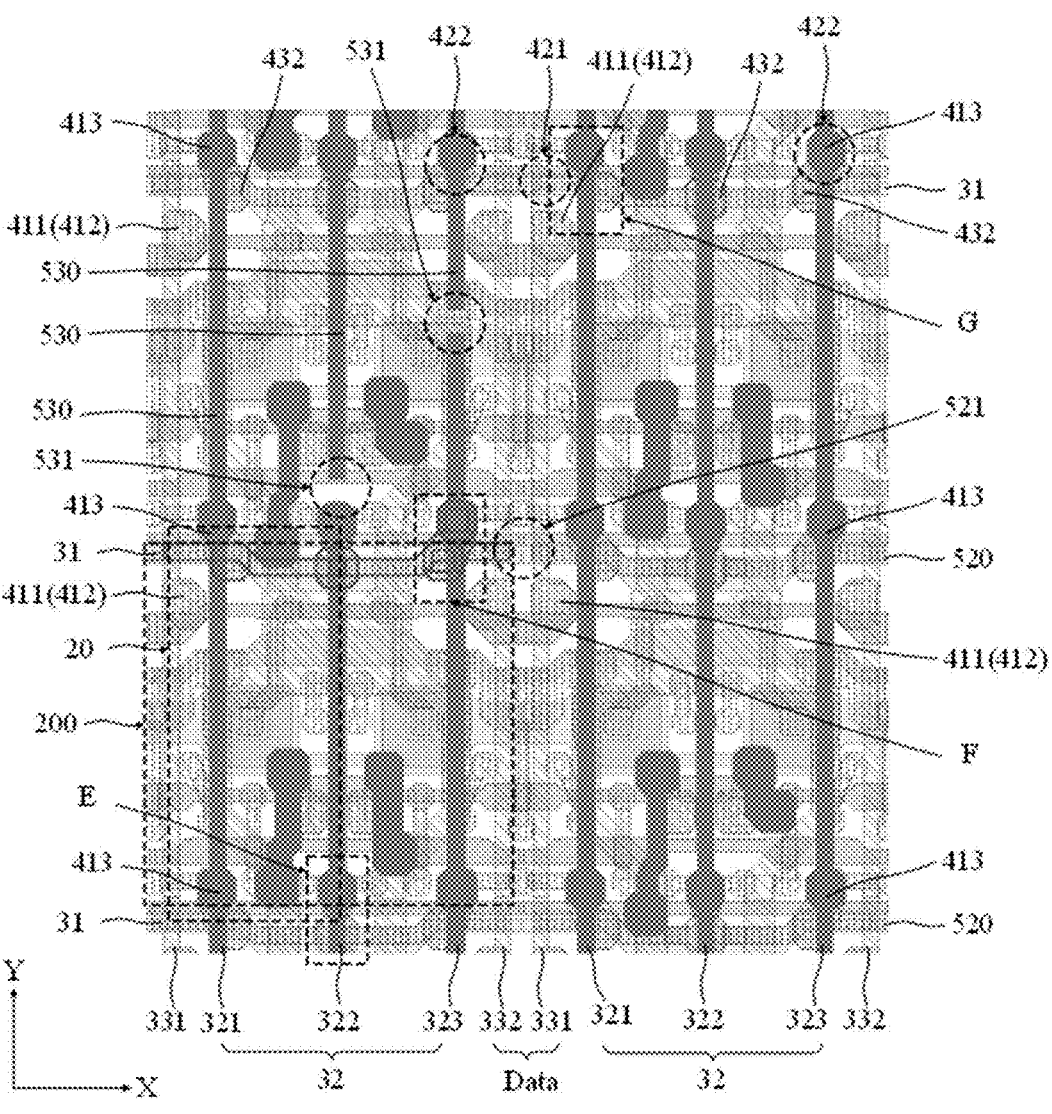
FIG. 7 is an enlarged view of a region B in FIG. 1.
Figure 8:
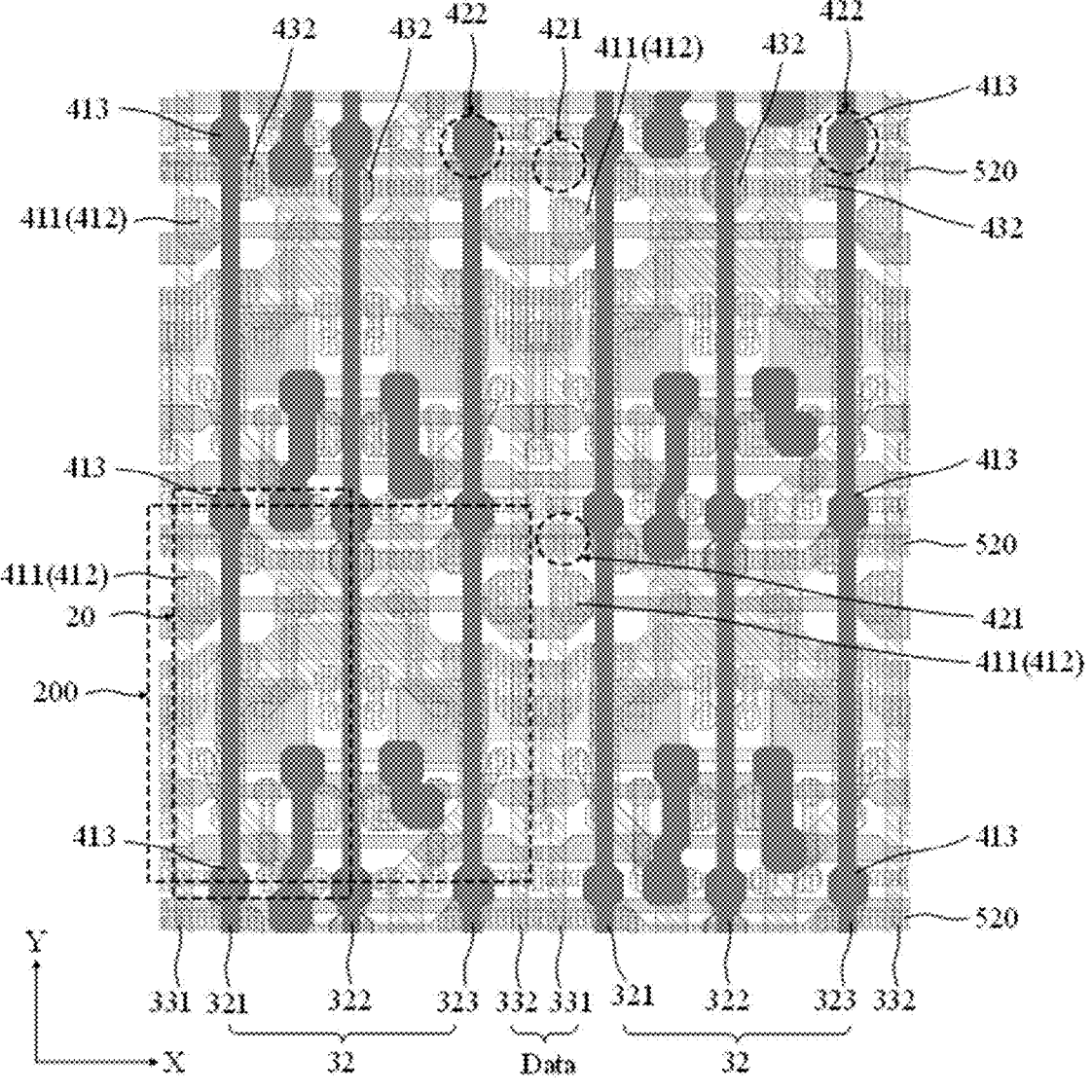
FIG. 8 is an enlarged view of a region C in FIG. 1.

Referring to FIGS. 6 to 8, FIG. 6 is an enlarged view of region A in FIG. 1, FIG. 7 is an enlarged view of region B in FIG. 1, and FIG. 8 is an enlarged view of region C in FIG. 1. FIGS. 6-8 show a diagram of a stack of film layers of eight sub-pixel circuits 20 distributed in an array, respectively.

In the configurations of FIGS. 6 to 8, two adjacent sub-pixel circuits of the sub-pixel circuits 20 may be configured as a sub-pixel circuit group 200, and then these sub-pixel circuit groups 200 may be arranged in an array. Two data wirings Data disposed at intervals may be provided between two adjacent sub-pixel circuit groups 200 in the first direction X, where one data wiring Data may be connected to an adjacent sub-pixel circuit 20, and three second fan-out segments 32 may be provided between two data wirings Data at both sides of one of the sub-pixel circuit groups 200, and a plurality of data wirings Data and a plurality of second fan-out segments 32 may be provided in a non-overlapping manner.

In the configurations of FIGS. 6 to 8, in one of the sub-pixel circuit groups 200, the three second fan-out segments 32 may be called as a first sub-fan-out segment 321, a second sub-fan-out segment 322, and a third sub-fan-out segment 323, respectively, and the two data wirings Data at both sides of the sub-pixel circuit group 200 may be called as a first data segment 331 and a second data segment 332, where the first sub-fan-out segment 321, the second sub-fan-out segment 322, and the third sub-fan-out segment 323 are all arranged in the first direction X, the first sub-fan-out segment 321 and the third sub-fan-out segment 323 are located outside the sub-pixel circuit group 200, the second sub-fan-out segment 322 is located in the middle of the sub-pixel circuit group 200, and the two sub-pixel circuits 20 in the sub-pixel circuit group 200 may be arranged symmetrically with respect to the second sub-fan-out segment 322.

In the configuration of FIGS. 6 to 8, the display panel 100 further includes a plurality of constant-voltage high-level lines VDD extending in the second direction Y, where each of the sub-pixel circuits 20 may be connected to one of the constant-voltage high-level lines VDD, the first sub-fan-out segment 321 and the third sub-fan-out segment 323 may partially overlap the constant-voltage high-level line VDD in the sub-pixel circuit 20, and the two sub-pixel circuits 20 may be arranged symmetrically with respect to the second sub-fan-out segment 322.

In the present embodiment, since the constant-voltage high-level lines VDD and the data wirings Data are both located at the second metal layer M2, the plurality of data wirings Data and the plurality of constant-voltage high-level lines VDD are provided in a non-overlapping manner so as to avoid the data wirings Data and the constant-voltage high-level lines VDD to be short-connected. Meanwhile, since different data signals are provided on the data wirings Data and the second fan-out segment 32, a parasitic capacitance may be generated if the data wirings Data and the second fan-out segments 32 overlap, so that the transmitted data signals are abnormal. Therefore, the present application can improve the parasitic capacitance between the plurality of data wirings Data and the plurality of second fan-out segments 32 by arranging the data wirings Data and the second fan-out segments 32 in a non-overlapping manner.

Figure 9:
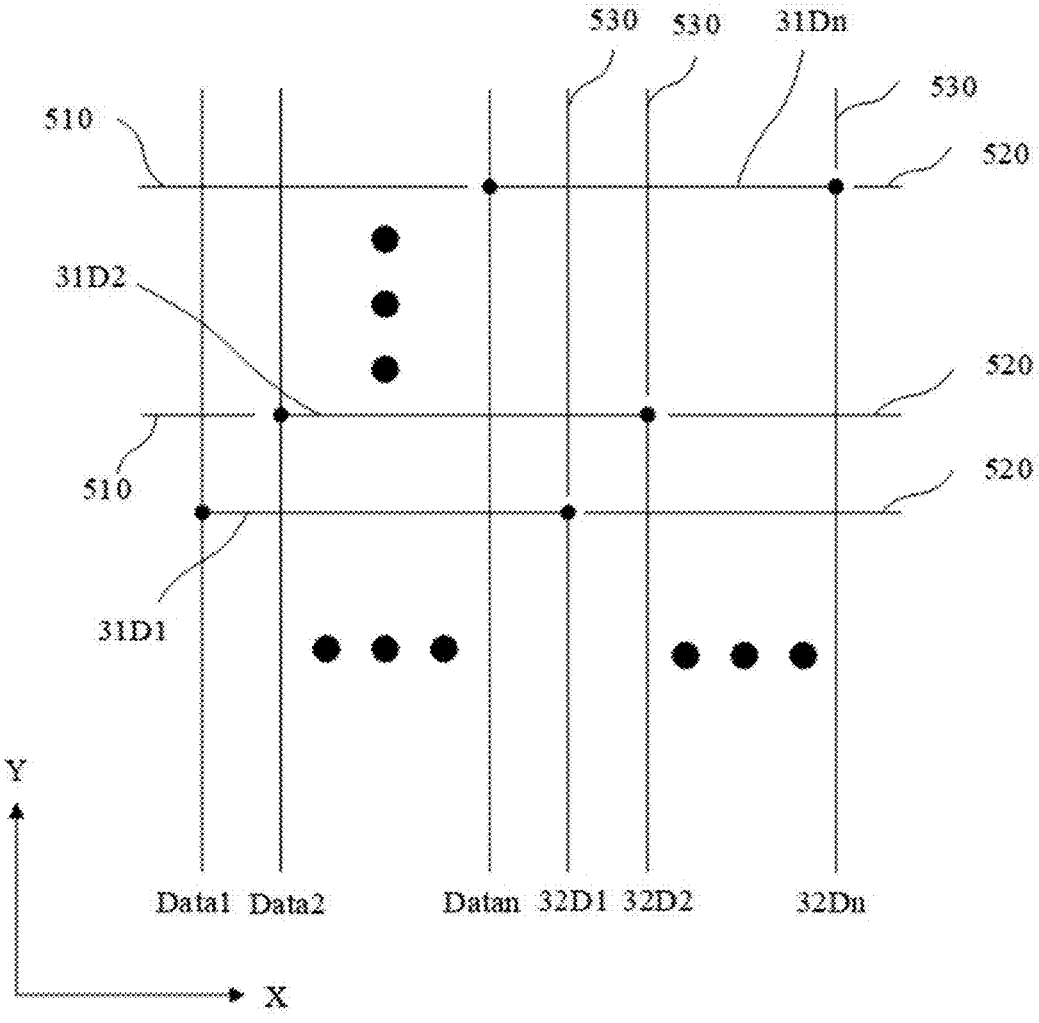
FIG. 9 is a diagram showing a transmission path of a data signal from a binding terminal to a data wiring in a display panel according to an embodiment of the present application.

In addition, FIG. 9 is shown for a transfer path of the data signal from the binding terminal 60 to the corresponding data wiring Data. Since the first fan-out segments 31 and the second fan-out segments 32 in the fan-out wiring area A2 are symmetrically arranged with respect to the centerline CL of the display panel 100, FIG. 9 shows only one-sided transfer path.

In the configuration of FIG. 9, the second fan-out segment 32D1 receives a data signal from the binding terminal 60, and then transfers the data signal to the data wiring Data1 through the first fan-out segment 31D1, the second fan-out segment 32D2 receives a data signal from the binding terminal 60, and then transfers the data signal to the data wiring Data2 through the first fan-out segment 31D2, and so on. The second fan-out segment 32Dn receives a data signal from the binding terminal 60, and then transfers the data signal to the data wiring Datan through the first fan-out segment 31Dn. Due to the presence of the second functional area A12, there is a portion of the area where a first fan-out segment 31 and a second fan-out segment 32 cannot be set correspondingly. However, three second fan-out segments 32 may be provided in each of the sub-pixel circuit groups 200, so that the display panel 100 has sufficient space for disposing the second fan-out segments 32.

It should be noted that positions of the data wirings Data and the second fan-out segments 32 in FIG. 9 are shown only as a schematic diagram. In a real diagram of a stack of film layers, for example, the configurations of FIGS. 6 to 8, the data wirings Data and the second fan-out segments 32 are interleaved. For example, three second fan-out segments 32 may be provided between the two data wirings Data.

In the display panel 100 of the present application, referring to FIG. 6 to FIG. 8, the first metal layer M1 further includes a plurality of first connection units 411 overlapping the plurality of data wirings Data, where a plurality of first overlapping portions 421 may be available by overlapping the plurality of first fan-out segments 31 and the plurality of data wirings Data, the plurality of first connection units 411 are disposed close to the first overlapping portions 421, and each of the first connection units 411 corresponds to one of the first overlapping portions 421, respectively.

In the configurations of FIGS. 6 to 8, since the data wiring Data has a narrow width, it is necessary to provide a first connection unit 411 having a large area at a connection point between the data wiring and the first fan-out segment 31 so as to electrically connect the data wiring Data to the first fan-out segment 31. Since the first connection unit 411 is provided only at the position where the electrical connection of the data wiring Data to the first fan-out segment 31 is required, the metal patterns inside the display panel 100 may be different, so that the mura of the display screen may be present when the metal patterns are mapped to the display screen. In the present application, the first connection unit 411 can be provided at a position close to an intersection of each of the first fan-out segments 31 and one of the data wirings Data, so that the differential design of the metal patterns can be avoided, and the mura of the screen can be also improved.

For example, in the configuration of FIG. 6, the first fan-out segment 31 is electrically connected to a first data segment 331 through the first connection unit 411 in the region D, while the other first connection units 411 in FIGS. 6 to 8 do not need to be electrically connected to the corresponding data wirings Data, thereby eliminating the differential design present only for the first connection unit 411 in the region D, and improving the mura of the screen.

Referring to FIG. 6, the first metal layer M1 may further include a plurality of extension segments 431 extending in the second direction Y, where the plurality of extension segments 431 and corresponding data wirings Data are arranged in an overlapping manner, and one end of each of the extension segments 431 is electrically connected to an adjacent first fan-out segment 31, the other end of the extension segment 431 is electrically connected to an adjacent first connection unit 411, which is further electrically connected to the first data segment 331 through the first through-hole HL1. In order to ensure the electrical connection between the first connection unit 411 and the first data segment 331, the area of the first connection unit 411 needs to satisfy a certain size, and a spacing between a region where an end of the first fan-out segment 31 is located and an adjacent transition segment 432 is too small to satisfy arrangement of the first connection unit 411. Therefore, there is a certain spacing between the first connection unit 411 and the end of the first fan-out segment 31 to avoid the transition segment 432.

In the configurations of FIGS. 6 to 8, the width of the first connection unit 411 is larger than the width of the data wiring Data, and the non-overlapping portion between the first connection unit 411 and the corresponding data wiring Data is located between the data wiring Data and the adjacent second fan-out segment 32 in the top view direction of the display panel 100.

In the present embodiment, since the width of the first connection unit 411 is larger than the width of the data trace Data, and the spacing between the first data segment 331 and the second data segment 332 is too small, the non-overlapping portion between the first connection unit 411 and the first data segment 331 needs to be disposed between the corresponding first data segment 331 and the first sub-fan-out segment 321. That is, the first connection unit 411 needs to be disposed as far away from the adjacent second data segment 332 as possible. In the configurations of FIGS. 6 to 8, a boundary of the first connection unit 411 close to a side of the second data segment 332 coincides with a boundary of the first data segment 331 where the first connection unit 411 is located, i.e., the first connection unit 411 is not disposed between the first data segment 331 and the second data segment 332 in the top view direction.

In the configurations of FIGS. 6 to 8, in a plurality of first connection units 411 corresponding to the same data wiring Data, a spacing between any two adjacent first connection units 411 of the first connection units 411 in the second direction Y is equal. In order to avoid the differential design of the metal patterns, the first connection units 411 are evenly distributed in the present embodiment. For example, in FIGS. 6 to 8, in the first connection units 411 overlapping the first data segment 331, the spacing between any two adjacent first connection units 411 in the second direction Y is equal, and in the first connection units 411 overlapping the second data segment 332, the spacing between any two adjacent first connection units 411 in the second direction Y is equal. Meanwhile, any two adjacent first connection units 411 located on different data wirings Data is equal in the first direction X.

In the configurations of FIGS. 6 to 8, the second metal layer M2 further includes a plurality of second connection units 412, where the plurality of second connection units 412 may be disposed close to the first overlapping portions 421, and each of the second connection units 412 corresponds to one of the first overlapping portions 421. The plurality of second connection units 412 are electrically connected to the corresponding data wirings Data, and an orthographic projection of each of the plurality of second connection units 412 on respective first connection unit 411 is positioned in the respective first connection unit 411.

In the configuration of FIG. 6, the second connection unit 412 and the first data segment 331 in the region D may be electrically connected with each other. Since the second connection unit 412 is located in the second metal layer M2 and the first connection unit 411 is located in the first metal layer M1, the connection metal of the lower layer needs to be large enough. For example, the area of the first connection unit 411 of the present application may be greater than or equal to the area of the second connection unit 412, and in some embodiments, the area of the first connection unit 411 may be less than the area of the second connection unit 412, so that the electrical connection can be stabilized.

In the present embodiment, the first connection units 411 can be provided so as to ensure that the first fan-out segment 31 can be stably electrically connected to the corresponding data wiring Data through the first through-hole HL1. However, since the width of the data wiring Data is narrower, there may be a risk of disconnection. However, arrangement of the second connection units 412 may equivalent to increasing the width of the data wiring Data, so that the second connection unit 412 can completely cover the respective first through-hole HL1. That is, a contact area between the data wiring data and the first connection unit 411 may be increased, thereby reducing the risk of disconnection and reducing a contact impedance.

In the configurations of FIGS. 6 and 9, the first metal layer M1 may further include a plurality of first functional wirings 510 extending in the first direction X, where the plurality of first functional wirings 510 may be located in the first functional area A11, each of the first functional wirings 510 corresponds to one of the first fan-out segments 31, the first functional wiring 510 is located on the same straight line as the first fan-out segment 31 and separated from the first fan-out segment 31.

In the present embodiment, each of the first functional wirings 510 may correspond to one of the first fan-out segments 31, and the first functional wiring 510 and the first fan-out segment 31 are in the same line. Although the first fan-out segments 31 are located in the first metal layer M1, the first fan-out segments 31 have only a horizontally disposed first fan-out segment 31, so that the metal patterns have a certain difference, which is also mapped to the display screen, resulting in the mura of the screen. The arrangement of the first function wirings 510 of the present application causes the horizontally disposed first fan-out segment 31 and the first functional wiring 510 to visually be at the same straight line, thereby eliminating the differential design of the metal patterns and improving the mura of the screen.

In the present embodiment, since the first fan-out segment 31 needs to transmit a data signal to the corresponding data wiring Data, the first fan-out segment 31 carries a variable data signal. If the first functional wiring 510 is electrically connected to the first fan-out segment 31, the first functional wiring 510 also carries the same data signal, so that an optional parasitic capacitance may be generated between the first functional wiring 510 and the adjacent metal wiring. Therefore, the first functional wiring 510 can be separated from the corresponding first fan-out segment 31 in the present embodiment. That is, the first functional wiring 510 can be insulated from the corresponding first fan-out segment 31.

In the configuration of FIG. 6, there is a first fracture 511 between the first functional wiring 510 and the first fan-out segment 31, which is located between two data wirings Data disposed between two adjacent sub-pixel circuit groups 200. Since the first fan-out segment 31 carries the variable data signal and the data wiring Data also carries the variable data signal, there is a small parasitic capacitance in the area where the first fan-out segment 31 and the data wiring Data are interleaved, and the first fan-out segment 31 can be electrically connected to the corresponding first data segment 331 through the extension segment 431. Therefore, in order to avoid the parasitic capacitance generated between the first fan-out segment 31 and the adjacent second data segment 332, a start position of the first fracture 511 between the first fan-out segment 31 and the first functional wiring 510 can be at a connection point between the first fan-out segment 31 and the extension segment 431. For example, in the configuration of FIG. 6, the first fracture 511 may be provided between the first data segment 331 and the second data segment 332, and since a spacing between the first data segment 331 and the second data segment 332 is smaller, no metal line is provided in the area between the first data segment 331 and the second data segment 332.

Referring to FIG. 9, since the connection point between the first fan-out segment 31 and the corresponding data wiring Data is gradually approached to the center line CL, the length of the first functional wiring 510 in the first direction X can be gradually increased in the second direction Y.

Referring to FIG. 6, the first functional wiring 510 may include a plurality of first functional segments, where each of the first functional segments corresponds to a sub-pixel circuit group 200, and the length of the first functional segment in the first direction X is equal to the spacing between the first data segment 331 and the second data segment 332 on both sides of the sub-pixel circuit group 200. There is a fracture between two adjacent first functional segments, which is disposed between the first data segment 331 and the second data segment 332.

In the present embodiment, the plurality of first functional segments on each of the first functional wirings 510 may be arranged continuously, that is, the first functional wiring 510 is a complete metal wiring. Meanwhile, each of the first functional wiring 510 can be electrically connected to the constant-voltage high-level line VDD or the constant-voltage low-level line VSS. That is, an impedance of the constant-voltage high-level line VDD or the constant-voltage low-level line VSS can be reduced, and a plurality of second functional wirings 520 can be further used as shield wirings to shield the of parasitic capacitance between adjacent metal wirings.

In the configurations of FIGS. 7 and 9, the first metal layer M1 may further include a plurality of second functional wirings 520 extending in the first direction X, where the plurality of second functional wirings 520 may be located in the second functional area A22, each of the second functional wirings 520 corresponds to two of the first fan-out segments 31, and is located on the same straight line as the two first fan-out segments 31 and separated from the two first fan-out segments 31.

In the present embodiment, since the display panel 100 includes two first wiring areas A21 that are located on both sides of the second wiring area A22 and arranged symmetrically with respect to the center line CL of the display panel 100, one second functional wiring 520 may correspond to the two first fan-out segments 31 and be located on the same line as the two first fan-out segments 31. Although the first fan-out segments 31 are located in the first metal layer M1, the first fan-out segments have only a horizontally disposed first fan-out segment 31, so that the metal patterns have a certain difference, which can be mapped to the display screen, resulting in the mura of the screen. The arrangement of the first function wirings 520 of the present application causes the horizontally disposed first fan-out segment 31 and the second functional wiring 520 to visually be at the same straight line, thereby eliminating the differential design of the metal patterns and improving the mura of the screen.

In the present embodiment, since the second functional wiring 520 corresponds to two first fan-out segments 31, the two first fan-out segments 31 are electrically connected to different data wirings Data. If the second functional wiring 520 is electrically connected to the two first fan-out segments 31, the two data wirings Data will have the same data signal. Therefore, in order to make transmission of the data signal normal, the second function wiring 520 may be disconnected from the corresponding one or two of the first fan-out segments 31. Next, since the first fan-out segment 31 needs to transmit a data signal to the corresponding data wiring Data, the first fan-out segment 31 carries a variable data signal. If the second functional wiring 520 is electrically connected to the first fan-out segment 31, the second functional wiring 520 also carries the same data signal, so that an optional parasitic capacitance may be generated between the first functional wiring 520 and the adjacent metal wiring. Therefore, the second functional wiring 520 can be separated from the corresponding two first fan-out segments 31 in the present embodiment. That is, the second functional wiring 520 can be insulated from the corresponding two first fan-out segments 31.

In the configuration of FIG. 7, there is a third fracture 521 between the second functional wiring 520 and the first fan-out segment 31, which is located between two data wirings Data disposed between two adjacent sub-pixel circuit groups 200. Since the first fan-out segment 31 carries the variable data signal and the data wiring Data also carries the variable data signal, there is a small parasitic capacitance in the area where the first fan-out segment 31 and the data wiring Data are interleaved. Therefore, in order to avoid the parasitic capacitance generated between the first fan-out segment 31 and the adjacent second data segment 332, a start position of the first fracture 521 between the first fan-out segment 31 and the third functional wiring 521 can be at a connection point between the first fan-out segment 31 and the second fan-out segment 32. For example, in the configuration of FIG. 7, the third fracture 521 may be provided between the first data segment 331 and the second data segment 332, and since a spacing between the first data segment 331 and the second data segment 332 is smaller, no metal line is provided in the area between the first data segment 331 and the second data segment 332.

Referring to FIG. 9, since the connection point between the first fan-out segment 31 and the corresponding data wiring Data is gradually approached to the center line CL, the length of the second functional wiring 520 in the first direction X can be gradually increased in the second direction Y.

Referring to FIG. 7, the second functional wiring 520 may include a plurality of second functional segments, where each of the second functional segments corresponds to a sub-pixel circuit group 200, and the length of the second functional segment in the first direction X is equal to the spacing between the first data segment 331 and the second data segment 332 on both sides of the sub-pixel circuit group 200. There may be a fracture between two adjacent second functional segments, which is disposed between the first data segment 331 and the second data segment 332.

In the present embodiment, the plurality of second functional segments on each of the second functional wirings 520 may be arranged continuously, that is, the first functional wiring 520 is a complete metal wiring. Meanwhile, each of the second functional wirings 520 can be electrically connected to the constant-voltage high-level line VDD or the constant-voltage low-level line VSS. That is, an impedance of the constant-voltage high-level line VDD or the constant-voltage low-level line VSS can be reduced, and a plurality of second functional wirings 520 can be further used as shield wirings to shield the of parasitic capacitance between adjacent metal wirings.

In the configuration of FIG. 6 to FIG. 8, the third metal layer M3 may further include a plurality of third connection units 413 overlapping the plurality of second fan-out segments 32, where a plurality of second overlapping portions 422 may be available by overlapping the plurality of second fan-out segments 32 and the plurality of first fan-out segments 31, the plurality of third connection units 413 are arranged close to the second overlapping portions 422, each of the third connection units 413 corresponds to one of the second overlapping portions 422, and the third connection units 413 are electrically connected to the respective data wirings Data.

In the configurations of FIGS. 6 to 8, since the data wiring Data has a narrow width, it is necessary to provide a third connection unit 413 having a large area at a connection point between the data wiring Data and the second fan-out segment 32 so as to electrically connect the data wiring Data to the second fan-out segment 32. Since the third connection unit 413 is provided only at the position where the electrical connection of the data wiring Data to the second fan-out segment 32 is required, the metal patterns inside the display panel 100 may be different, so that the mura of the display screen may be present when the metal patterns are mapped to the display screen. In the present application, the third connection unit 413 can be provided at a position close to an intersection of each of the second fan-out segments 32 and one of the first fan-out segments 31, so that the differential design of the metal patterns can be avoided, and the mura of the screen can be also improved.

For example, in the regions E, F, and G in the configuration of FIG. 7, the third connection unit 413 in the region E can be configured to electrically connect the second sub-fan-out segment 322 and the corresponding first fan-out segment 31 overlapped in the region E, the third connection unit 413 in the region F can be configured to electrically connect the third sub-fan-out segment 323 and the corresponding first fan-out segment 31 overlapped in the region F, and the third connection unit 413 in the region G can be configured to electrically connect the first sub-fan-out segment 321 and the corresponding first fan-out segment 31 overlapped in the region G. The other first connection units 411 in FIGS. 6 to 8 do not need to be electrically connected to the corresponding first fan-out segments 31, thereby eliminating the differential design of the third connection units 413 only present in the regions E, F, and G, and improving the mura of the screen.

In the present embodiment, similar to the first connection unit 411 and the second connection unit 412, since the second fan-out segment 32 has a narrow line width, it is necessary to provide the third connection unit 413 having a large area to ensure that the second fan-out segment 32 is electrically connected to the corresponding first fan-out segment 31. However, since a spacing between the second fan-out segment 32 and either the adjacent data wiring Data or other second fan-out segment 32 is larger, the center point of the third connection unit 413 of the present application may coincide with the center axis of the corresponding data wiring Data. For example, in the configurations of FIGS. 6 to 8, a plurality of third connection units 413 are uniformly provided on the second fan-out segment 32 and symmetrically provided with respect to the central axis of the second fan-out segment 32.

Referring to FIGS. 4 and 7, the second metal layer M2 may further include a plurality of transition segments 432 disposed close to the plurality of second overlapping portions 422, where each of the transition segments 432 corresponding to one of the second overlapping portions 422, a first end of the transition segment 432 overlaps a corresponding third connection unit 413 and electrically connected to the corresponding third connection unit 413 by one of the plurality of second through-hoes HL2, and a second end of the transition segment 432 overlaps a corresponding first fan-out segment 31 and electrically connected to the corresponding first fan-out segment 31 by one of the plurality of third through-holes HL3, and the plurality of second through-holes HL2 and the plurality of third through-holes HL3 may be disposed on the second intersection line L2.

In the present embodiment, since the second fan-out segment 32 is located at the third metal layer M3 and the first fan-out segment 31 is located at the first metal layer M1, the spacing between the third metal layer M3 and the first metal layer M1 is too large. An opening size of a wiring switching hole for switching the wiring from the third metal layer M3 to the first metal layer M1 needs to be large enough to ensure stable connection between the second fan-out segment 32 and the first fan-out segment 31. Since the metal wiring in the area having the wiring switching hole is dense and there is not enough space for arranging the wire switching hole, the present application can improve the problem that the opening size of the wire switching hole is insufficient by arranging the transition segment 432 in the second metal layer M2.

Referring to FIG. 6 to FIG. 8, in one of the sub-pixel circuit groups 200, two transition segments 432 electrically connected to the first sub-fan-out segment 321 and the third sub-fan-out segment 323 are provided at an included angle with the corresponding second fan-out segment 32, and an overlapping region in which the two transition segments 432 and the corresponding first fan-out segment 31 overlap may be provided between the first sub-fan-out segment 321 and the third sub-fan-out segment 323, and the transition segment 432 electrically connected to the second sub-fan-out segment 322 may be parallel to and overlap the corresponding third fan-out segment.

The configuration in FIG. 7 may be taken as an example. Since the spacing between the horizontally disposed first fan-out segment 31 and the first connection unit 411 in the second direction Y is smaller, the first fan-out segment 31 needs to be disposed away from the first connection unit 411 so as to avoid the first fan-out segment 31 and the first connection unit 411 to be short-connected. Therefore, as shown in FIG. 10, the horizontally disposed first fan-out segment 31 includes a transverse segment 311, an avoidance segment 313, and an inclined segment 312, where the transverse segment 311 is electrically connected to the avoidance segment 313 through the inclined segment 312, and a spacing between the avoidance segment 313 and the third connection unit 413 in the second direction Y is smaller than that between the transverse segment 311 and the third connection unit 413 in the second direction Y.

Figure 10:
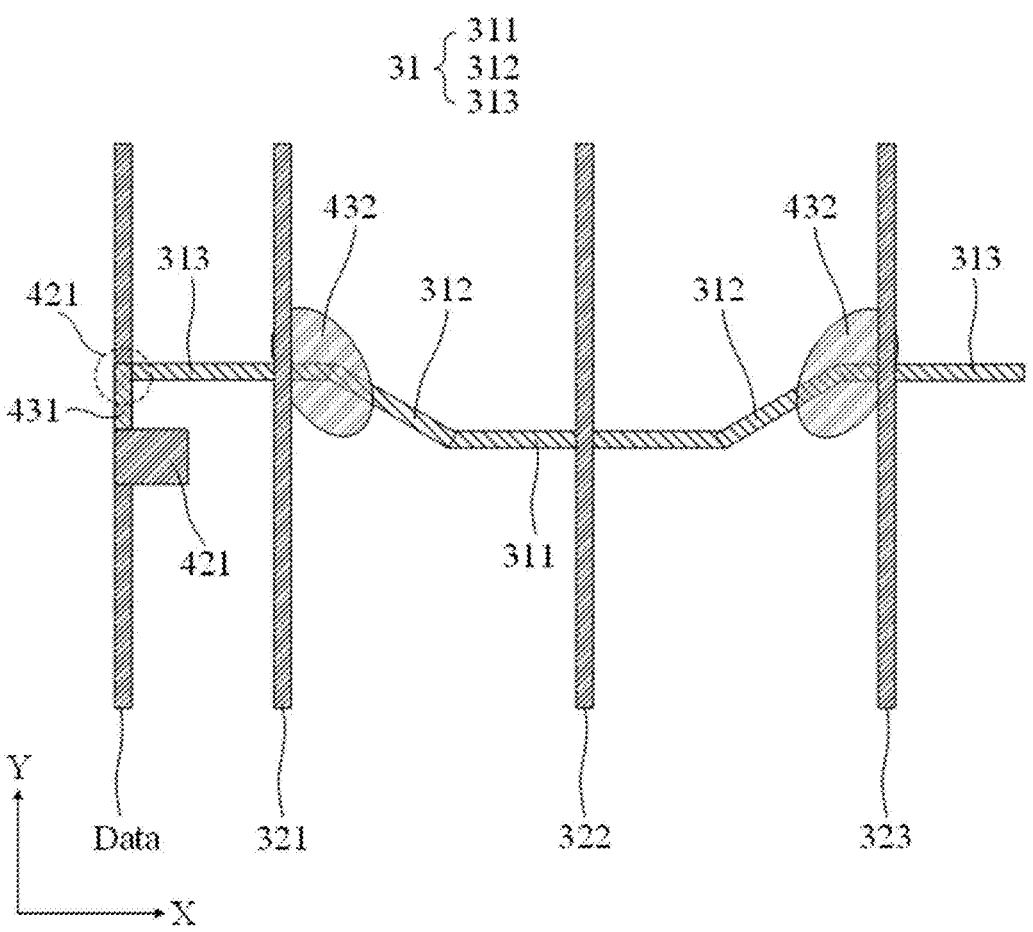
FIG. 10 is a simplified diagram of a region H in FIG. 6.

In the configurations of FIGS. 7 and 10, since the spacing between the corresponding first fan-out segment 31 and either the first sub-fan-out segment 321 or the third sub-fan-out segment 323 is so small that the second through-hole HL2 and the third through-hole HL3 cannot be provided at the small spacing at the same time, the third connection unit 413 corresponding to the first sub-fan-out segment 321 and the third sub-fan-out segment 323 is connected to the inclined segment 312 in the first fan-out segment 31 through the transition segment 432 in the present application.

In the configurations of FIGS. 7 and 10, the spacing between the second sub-fan-out segment 322 and the corresponding first fan-out segment 31 may accommodate the second through-hole HL2 and the third through-hole HL3, so that the third connection unit 413 corresponding to the second sub-fan-out segment 322 is connected to the transverse segment 311 in the first fan-out segment 31 through the transition segment 432. In the present embodiment, an included angle between the transition segment 432 connected to the second sub-fan-out segment 322 and the corresponding sub-fan-out segment may be 0, that is, the transition segment 432 may be disposed perpendicular to the transverse segment 311, and the transition segment 432 may be parallel to and overlap the corresponding second sub-fan-out segment 322.

In the present embodiment, since the transition segment 432 connected to the first sub-fan-out segment 321 and the third sub-fan-out segment 323 is connected to the inclined segment 312 and positioning of the inclined segment 312 is more difficult than the positioning of the transverse segment 311 when a through-hole design is performed for the inclined segment 312, an area of an end portion in the transition segment 432 connected to the inclined segment 312 needs to be larger than that of an end portion in the transition segment 432 connected to the second fan-out segment 32 to ensure the stable connection between the transition segment 432 and the inclined segment 312. Since the transition segment 432 connected to the second sub-fan-out segment 322 is directly connected to the transverse segment 311, both end portions of the transition segment 432 may have equal areas.

In the configurations of FIGS. 6 to 8, the third metal layer M3 may further include a plurality of third functional wirings 530 extending in the second direction Y, where the plurality of third functional wirings 530 may be located in the first functional area A11, each of the third functional wirings 530 corresponds to one of the second fan-out segments 32, and the third functional wiring 530 is located on the same straight line as the second fan-out segment 32 and separated from the second fan-out segment 32.

Referring to FIGS. 6 to 8, each of the third functional wirings 530 may correspond to one of the second fan-out segments 32, and the second functional wiring 520 and the second fan-out segment 32 are in the same line. The second fan-out segments 32 are located in the third metal layer M3, the second fan-out segments 32 have only a longitudinally disposed second fan-out segment 32, so that the metal patterns have a certain difference, which can be mapped to the display screen under the action of the metal reflection, resulting in the mura of the screen. The arrangement of the third functional wirings 530 of the present application causes the horizontally disposed second fan-out segment 32 and the third functional wiring 530 to visually be at the same straight line, thereby eliminating the differential design of the metal patterns and improving the mura of the screen.

In the present embodiment, since the second fan-out segment 32 needs to transmit a data signal to the corresponding data wiring Data, the second fan-out segment 32 carries a variable data signal. If the third functional wiring 530 is electrically connected to the second fan-out segment 32, the third functional wiring 530 also carries the same data signal, so that the third functional wiring 530 may overlap an anode in the sub-pixel unit and an optional parasitic capacitance may be generated between the third functional wiring 530 and the anode. Therefore, the third functional wiring 530 can be separated from the corresponding second fan-out segment 32 in the present embodiment. That is, the third functional wiring 530 can be insulated from the corresponding second fan-out segment 32.

In the configuration of FIG. 7, there is a second fracture 531 between the third functional wiring 530 and the second fan-out segment 32. The second fan-out segment 32 in the present embodiment carries a variable data signal, and the anode receives a corresponding data signal. However, since the second fan-out segment 32 and the anode located in the same sub-pixel carry different data signals, if the second fan-out segment 32 and the anode are overlapped, a parasitic capacitance may be generated in the overlapped region, so that a pixel voltage received by the anode is abnormal. In the present application, in the top view direction of the display panel 100, the second fracture 531 is disposed in a non-overlapping manner with the anode in the display panel 100, and arrangement of the second fracture 531 avoids arrangement of the anode in the sub-pixel unit, so that the second fan-out segment 32 is disposed in an overlapping manner with as few anodes as possible, thereby improving abnormality of the data signal received by the anode. For example, in the configuration of FIG. 7, the second sub-fan-out segment 322 and the third sub-fan-out segment 323 both have the second fracture 531. The specific position of the second fracture 531 is not specifically limited in the present application, and the second fracture 531 does not overlap the anode in the corresponding sub-pixel.

Referring to FIG. 7, a plurality of third connection units 413 are further provided on the plurality of third functional wirings 530. The spacing of any two adjacent third connection units 413 on the third functional wirings 530 is equal to that of any two adjacent third connection units 413 on the second fan-out segments 32. Since the plurality of third connecting units 413 are provided on the plurality of second fan-out segments 32, the plurality of third connection units 413 are also provided on the third functional wirings 530, and the spacing between the any two adjacent third connection units 413 on the third functional wirings 530 in the second direction Y is equal to that of any two adjacent third connection units 413 on the second fan-out segments 32 in the second direction Y so as to maintain the uniformity of the metal patterns.

Referring to FIG. 9, since the connection point between the first fan-out segment 31 and the corresponding data wiring Data is gradually approached to the center line CL, the length of the third functional wiring 530 in the second direction Y can be gradually decreased in the first direction X, and the length of the third functional wiring 530 at the position of the centerline CL is minimum.

In the present embodiment, the third functional wiring 530 may include a plurality of third functional segments, where each of the third functional segments may correspond to a sub-pixel circuit group 200, the length of the third functional segment in the second direction Y is equal to the spacing of the sub-pixel circuit group in the second direction Y, and a fracture may be also present between two adjacent third functional segments.

In the present embodiment, the plurality of third functional segments on each of the third functional wirings 530 may be arranged continuously, that is, the third functional wiring 530 is a complete metal wiring. Meanwhile, each of the third functional wirings 530 can be electrically connected to the constant-voltage high-level line VDD or the constant-voltage low-level line VSS. That is, an impedance of the constant-voltage high-level line VDD or the constant-voltage low-level line VSS can be reduced, and the plurality of third functional wirings 530 can be further used as shield wirings to shield the of parasitic capacitance between adjacent metal wirings.

In the present embodiment, at least one of the first functional wiring 510, the second functional wiring 520, or the third functional wiring 530 is connected to the constant-voltage low-level line VSS or the constant-voltage high-level line VDD. If the three kinds of functional wirings are correspondingly connected to the constant-voltage lines, the three kinds of functional wirings are all connected to the same constant-voltage line. For example, the first functional wiring 510, the second functional wiring 520, and the third functional wiring 530 are all connected to the constant-voltage low-level line VSS. Alternatively, the first functional wiring 510, the second functional wiring 520, and the third functional wiring 530 are all connected to the constant-voltage high-level line VDD.

In the present embodiment, for the second functional area A12 of the present application, since the first fan-out segment 31 and the second fan-out segment 32 are not present in the area A12, a plurality of fourth functional wirings and a plurality of fifth functional wirings may also be provided in the second functional area A12 so as to avoid the differential design of the metal patterns.

In the present embodiment, the fourth functional wirings are parallel to the first functional wirings 510, and a spacing between the two adjacent fourth functional wirings in the second direction Y is equal to that between the two adjacent first functional wirings 510. Similarly, the fifth functional wirings are parallel to the third functional wirings 530, and a spacing between the two adjacent fifth functional wirings in the first direction X is equal to the that between the two adjacent third functional wirings 530.

In the present embodiment, the plurality of fourth functional wirings and the plurality of fifth functional wirings may be all connected to the constant-voltage low-level line VSS. Alternatively, the plurality of fourth functional wirings and the plurality of fifth functional wirings may be all connected to the constant-voltage high-level line VDD. The constant-voltage lines all connected to the fourth functional wirings and the fifth functional wirings are the same as the constant-voltage lines all connected to the first functional wirings 510, the second functional wirings 520, and the third functional wirings 530.

In the present embodiment, FIG. 3 is a schematic diagram for describing only the equivalent circuit diagram in FIG. 2. Stacking of a portion of the metal wirings in FIG. 3 differs from those of FIGS. 6 to 8. A diagram of a stack of film layers of the display panel of the present application is mainly shown in the configurations of FIGS. 6 to 8.

Another embodiment of the present application provides a display terminal including the above-described display panel. The display terminal may be any product or component having a display function, such as a mobile phone, a tablet computer, a television, a display, a notebook computer, a digital photo frame, a navigator, or the like.

It can be understood that, for those ordinary skilled in the art, equivalent replacements or changes can be made according to the technical solutions and inventive concepts of the present disclosure, and all such changes or replacements should fall within the protection scope of the claims appended to the present disclosure.

What is claimed is:

1. A display panel, comprising:
a base substrate;
a first metal layer disposed on the base substrate and having a plurality of first fan-out segments extending in a first direction, wherein the first fan-out segments are located in a display area of the display panel;
a third metal layer disposed on one side of the first metal layer away from the base substrate and having a plurality of second fan-out segments extending in the second direction, wherein the plurality of second fan-out segments are located in the display area, and one end of the first fan-out segment is electrically connected to one of the second fan-out segments; and
a plurality of sub-pixel circuit groups arranged in an array, wherein each one of the sub-pixel circuit groups comprises two sub-pixel circuits arranged symmetrically with respect to respective one of the second sub-fan-out segments.

2. The display panel of claim 1, wherein the display panel comprises a binding terminal located at one side of the display area and a second metal layer disposed between the first metal layer and the third metal layer, the display area comprises a functional wiring area and a fan-out wiring area, the fan-out wiring area is located at one end of the display area close to the binding terminal, the second metal layer comprises a plurality of data wirings extending in a second direction, the plurality of data wirings are located in the display area, and another end of each of the first fan-out segments is electrically connected to one of the data wirings, and an included angle between the first direction and the second direction is greater than 0° and less than or equal to 90°; and
wherein the first fan-out segments and the second fan-out segments are located in the fan-out wiring area, a first end of each of the first fan-out segments is electrically connected to one of the data wirings through one of a plurality of first through-holes, the plurality of first through-holes are located on a first intersection line between the fan-out wiring area and the functional wiring area, and one end of each of the second fan-out segments away from the first fan-out segment coincides with a boundary of the display area.

3. The display panel of claim 2, wherein the fan-out wiring area comprises a first wiring area and a second wiring area, the first wiring area is located on both sides of the second wiring area, the first fan-out segments are located within the first wiring area, the second fan-out segments are located within the second wiring area, and an inflection point between each of the first fan-out segments and corresponding one of the second fan-out segments is located on a second intersection line between the first wiring area and the second wiring area; and
the functional wiring area comprises a first functional area located at one side of the first wiring area away from the binding terminal and a second functional area located at one side of the first wiring area close to the binding terminal, wherein a third intersection line between the second functional area and the first wiring area is parallel to the first direction, and a fourth intersection line between the second functional area and the second wiring area is parallel to the second direction.

4. The display panel of claim 3, wherein
two data wirings of the data wirings disposed at intervals are provided between two adjacent sub-pixel circuit groups of the sub-pixel circuit groups in the first direction, wherein one data wiring of the two data wirings is connected to a sub-pixel circuit adjacent to the one data wiring, and three second fan-out segments of the second fan-out segments are provided between two data wirings at both sides of one of the sub-pixel circuit groups, and the plurality of data wirings are disposed in a non-overlapping manner with the plurality of second fan-out segments.

5. The display panel of claim 4, further comprising a plurality of constant-voltage high-level lines extending in the second direction, and each of the sub-pixel circuits is connected to one of the constant-voltage high-level lines; and in one of the sub-pixel circuit groups, the three second fan-out segments comprises a first sub-fan-out segment, a second sub-fan-out segment, and a third sub-fan-out segment arranged in the first direction, wherein the first sub-fan-out segment and the third sub-fan-out segment partially overlap corresponding constant-voltage high-level lines connected to sub-pixel circuits respectively comprising the first sub-fan-out segment and the third sub-fan-out segment, and the two sub-pixel circuits in the sub-pixel circuit group are disposed symmetrically with respect to the second sub-fan-out segment.

6. The display panel of claim 5, wherein the first metal layer further comprises a plurality of first connection units overlapping the plurality of data wirings, a plurality of first overlapping portions are available by overlapping the plurality of first fan-out segments and the plurality of data wirings, the plurality of first connection units are disposed close to the first overlapping portions, and each of the first connection units corresponds to one of the first overlapping portions; and the first metal layer further comprises a plurality of extension segments extending in the second direction, wherein the plurality of extension segments and are disposed in an overlapping manner with the data wirings corresponding to the extension segments, and one end of each of the extension segments is electrically connected to a first fan-out segment adjacent to the extension segment, another end of the extension segment is electrically connected to one of the first connection units adjacent to the extension segment, and the first connection unit is electrically connected to one of the data wirings corresponding to the first connection unit through respective one of the first through-holes.

7. The display panel of claim 6, wherein, in the plurality of first connection units corresponding to the same data wiring, a spacing between any two adjacent first connection units of the first connection units in the second direction is equal.

8. The display panel of claim 6, wherein, a width of each of the first connection units is greater than a width of one of the data wirings, and a non-overlapping portion between the first connection unit and the data wiring corresponding to the first connection unit is located between the data wiring and one of the second fan-out segments adjacent to the data wiring in a top view direction of the display panel.

9. The display panel of claim 8, wherein the second metal layer further comprises a plurality of second connection units disposed close to the first overlapping portions, and each of the second connection units corresponds to one of the first overlapping portions, respectively; and each of the plurality of second connection units is electrically connected to corresponding one of the data wirings, and an orthographic projection of the second connection unit on the corresponding first connection unit is located in the first connection unit.

10. The display panel of claim 6, wherein the first metal layer further comprises a plurality of first functional wirings extending in the first direction, the plurality of first functional wirings are located in the first functional area, and each of the first functional wirings corresponds to one of the first fan-out segments and is located on the same straight line as the first fan-out segment; and the first functional wiring is separated from the first fan-out segment.

11. The display panel of claim 10, wherein a first fracture is provided between the first functional wiring and the first fan-out segment and located between two data wirings disposed between two adjacent sub-pixel circuit groups of the sub-pixel circuit groups.

12. The display panel of claim 10, wherein the first metal layer further comprises a plurality of second functional wirings extending in the first direction, the plurality of second functional wirings are located in the second functional area, and each of the second functional wirings corresponds to two of the first fan-out segments and is located on the same straight line as the two first fan-out segments; and the second functional wiring is separated from the two first fan-out segments.

13. The display panel of claim 5, wherein the third metal layer further comprises a plurality of third connection units overlapping the plurality of second fan-out segments, a plurality of second overlapping portions are available by overlapping the plurality of second fan-out segments and the plurality of first fan-out segments, the plurality of third connection units are disposed close to the second overlapping portions, and each of the third connection units corresponds to one of the second overlapping portions and is electrically connected to the corresponding one of the data wirings; and the second metal layer further comprises a plurality of transition segments disposed close to the plurality of second overlapping portions, wherein each of the transition segments corresponds to one of the second overlapping portions, a first end of the transition segment overlaps corresponding one of the third connection units and electrically connected to the corresponding third connection unit through one of a plurality of second through-hoes, and a second end of the transition segment overlaps corresponding one of the first fan-out segments and electrically connected to the corresponding first fan-out segment through one of a plurality of third through-holes, and the plurality of second through-holes and the plurality of third through-holes are disposed on the second intersection line.

14. The display panel of claim 13, wherein, in one of the sub-pixel circuit groups, two transition segments of the transition segments electrically connected to the first sub-fan-out segment and the third sub-fan-out segment are provided at an included angle with corresponding one of the second fan-out segments, and an overlapping region in which the two transition segments overlap corresponding one of the first fan-out segments is located between the first sub-fan-out segment and the third sub-fan-out segment; and each of the transition segments electrically connected to the second sub-fan-out segment is parallel to and overlaps corresponding one of the third fan-out segments.

15. The display panel of claim 13, wherein the third metal layer further comprises a plurality of third functional wirings extending in the second direction, the plurality of third functional wirings are located in the first functional area, and each of the third functional wirings corresponds to one of the second fan-out segments and is located on the same straight line as the second fan-out segment; and the third functional wiring is separated from the second fan-out segment.

16. The display panel of claim 15, wherein a plurality of third connection units are further provided on the plurality of third functional wirings, a spacing of any two adjacent third connection units of the third connection units on the third functional wiring is equal to a spacing of any two adjacent third connection units of the third connection units on the second fan-out segments.

17. The display panel of claim 15, wherein a second fracture is provided between the third functional wiring and the second fan-out segment; and the second fracture is disposed in a non-overlapping manner with an anode in the display panel in a top view direction of the display panel.

18. The display panel of claim 15, further comprising a constant-voltage low-level line provided at a periphery of the display area; and wherein at least one of the first functional wiring, the second functional wiring, or the third functional wiring is connected to the constant-voltage low-level wiring.

19. The display panel of claim 1, further comprising a plurality of light emission control signal lines and a plurality of anode reset lines extending in the first direction, wherein the plurality of light emission control signal lines and the plurality of anode reset lines are provided between the base substrate and the first metal layer, and the plurality of light emission control signal lines are insulated from the plurality of anode reset lines; and the light emission control signal lines partially overlap the anode reset lines in a top view direction of the display panel.

20. A display terminal, comprising a display panel, wherein the display panel comprises:

a base substrate;

a first metal layer disposed on the base substrate and having a plurality of first fan-out segments extending in a first direction, wherein the first fan-out segments are located in a display area of the display panel;

a third metal layer disposed on one side of the first metal layer away from the base substrate and having a plurality of second fan-out segments extending in the second direction, wherein the plurality of second fan-out segments are located in the display area, and a second end of the first fan-out segment is electrically connected to one of the second fan-out segments; and a plurality of sub-pixel circuit groups arranged in an array, wherein each one of the sub-pixel circuit groups comprises two sub-pixel circuits arranged symmetrically with respect to respective one of the second sub-fan-out segments.

\* \* \* \* \*